United States Patent [19]
Kim et al.

[11] Patent Number: 5,808,953
[45] Date of Patent: Sep. 15, 1998

[54] INTERNAL VOLTAGE GENERATING CIRCUIT FOR SEMICONDUCTOR MEMORY APPARATUS

[75] Inventors: Sam Soo Kim; Yong Hyun Jun, both of Seoul, Rep. of Korea

[73] Assignee: LG Semicon Co., Ltd., Cheongju, Rep. of Korea

[21] Appl. No.: 559,702

[22] Filed: Nov. 15, 1995

[30] Foreign Application Priority Data

Nov. 15, 1994 [KR]  Rep. of Korea .................. 29941/1994

[51] Int. Cl.$^6$ .................................................. G11C 13/00
[52] U.S. Cl. ................ 365/226; 365/189.01; 365/230.01
[58] Field of Search .............................. 365/226, 189.01, 365/230.01

[56] References Cited

U.S. PATENT DOCUMENTS

| | | | |
|---|---|---|---|
| 4,482,985 | 11/1984 | Itoh et al. ............................... | 365/226 |
| 4,780,854 | 10/1988 | Watanabe et al. . | |
| 5,077,518 | 12/1991 | Han . | |

*Primary Examiner*—Terrell W. Fears
*Attorney, Agent, or Firm*—Fleshner & Kim

[57] ABSTRACT

An improved internal voltage generating circuit for a semiconductor memory apparatus capable of enhancing reliability and stability of a burn-in operation by providing the BEN and the BEX which have a certain hysteresis characteristic and capable of previously compensating a possible internal source voltage drop by increasing the level of internal source voltage by supplying a constant current to an external voltage through a driving transistor when a sense amplifying circuit which consume more voltage starts operating, which includes a first reference voltage generator for generating a bias reference voltage; a voltage level detector for detecting an external voltage at the time of a burn-in operation by receiving the output of the first reference voltage generator; a second reference voltage generator for generating a reference voltage which is obtained by amplifying a voltage level by a certain ratio; a standby differential amplifier for comparing the reference voltage outputted from the second reference voltage generator and an internal source voltage and for controlling a drive at the time of a standby; and an active differential amplifier for comparing the reference voltage of the second reference voltage generator and an internal source voltage and for compensating an internal source voltage drop at the time when a sense amplifier becomes activated.

15 Claims, 5 Drawing Sheets

INTERNAL VOLTAGE GENERATING CIRCUIT FOR SEMICONDUCTOR MEMORY APPARATUS

BACKGROUND OF THE INVENTION

1. Field of the Invention

The present invention relates to an internal voltage generating circuit for a semiconductor memory apparatus, and in particular to an improved internal voltage generating circuit for a semiconductor memory apparatus capable of enhancing reliability and stability of a burn-in operation by providing a burn-in entry voltage (hereinafter called the "BEN") and a bum-in exit voltage (hereinafter called the "BEX"), which have a certain hysteresis characteristic and are capable of compensating a possible internal source voltage drop by increasing internal source voltage by supplying a constant current to an external voltage through a driving transistor when a sense amplifying circuit which consume more voltage operates.

2. Description of the Conventional Art

In the industry, so as to increase reliability of a chip and to achieve low voltage consumption of a chip, use of an internal voltage generating circuit increases for driving a device in the chip with a relatively low voltage. The internal voltage generating circuit has a characteristic of having a constant voltage level irrespective of variation of externally supplied voltage at a normal operation range to ensure stability and reliability of a chip. When the level of an externally supplied voltage exceeds the normal operation range and is converted into a burn-in operation range, the internal voltage generating circuit which keeps a constant voltage level generates a certain voltage proportional to the variation level of an externally supplied voltage.

Figure 1:
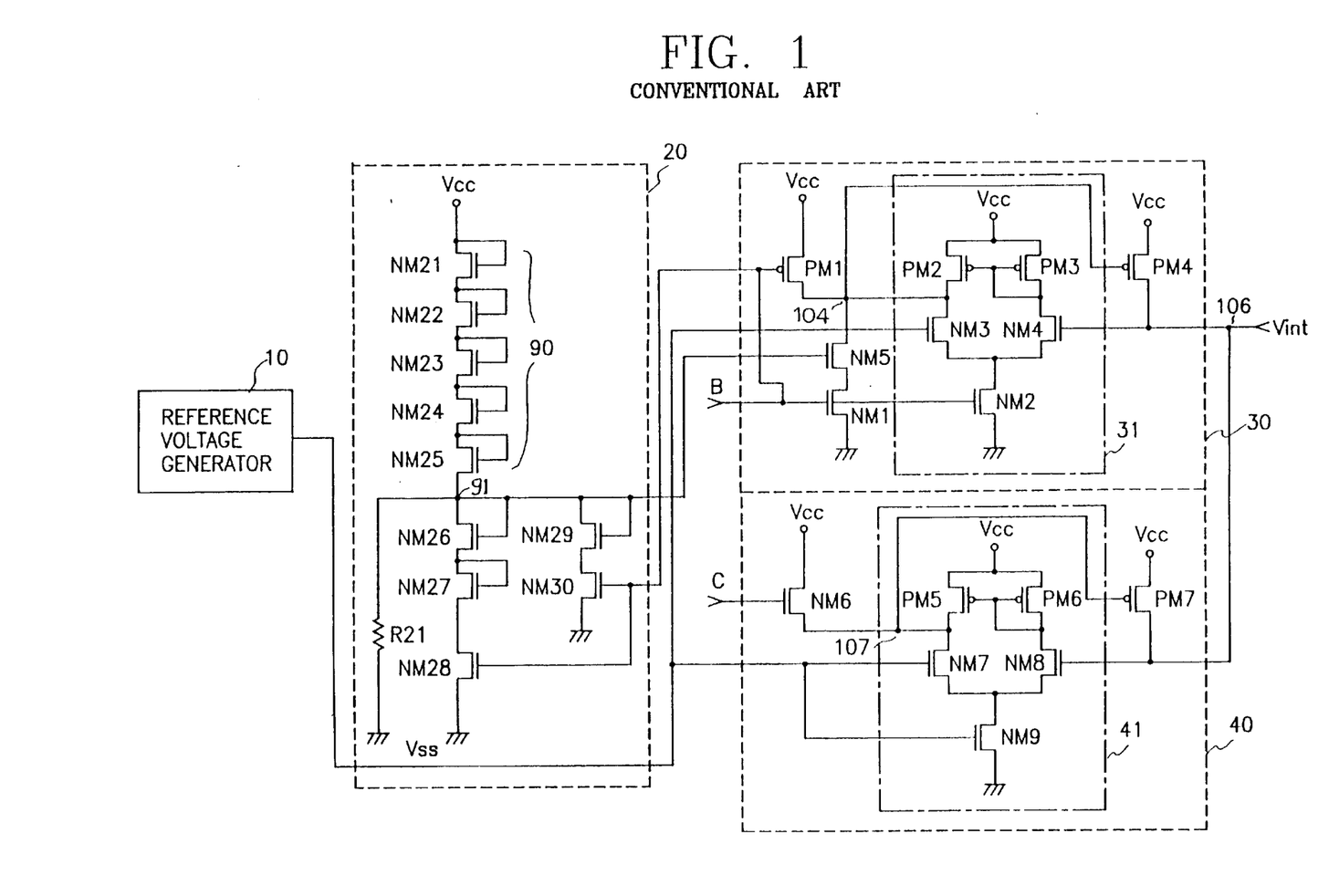
FIG. 1 is a block diagram of a conventional internal voltage generating circuit.

Referring to FIG. 1, a conventional internal voltage generating circuit includes a reference voltage generator 10 for generating a reference voltage Vref, a voltage level detector 20 for detecting an externally supplied voltage during a burn-in operation, an active differential amplifier 30 for comparing an active internal source voltage Vint and a reference voltage Vref of the reference voltage generator 10 and for controlling the operations thereof, and a standby differential amplifier 40 for comparing a standby internal source voltage Vint and a reference voltage Vref of the reference voltage generator 10 and for controlling the operations thereof.

In the voltage level detector 20, an NMOS transistor row 90 consisting of five NMOS transistors are serially connected between an external voltage terminal and a detection node 91, and a resistance R21 is connected between the detection node 91 and a grounded voltage, and NMOS transistors NM26 and NM27 are serially connected to the detection node 91, respectively, and an NMOS transistor NM28 is connected between an NMOS transistor NM27 and a grounded voltage, and in which a gate is connected to an input terminal of a first control signal B, and a drain and a gate of an NMOS transistor NM29 are connected to the detection node 91, respectively, and an NMOS transistor NM30 is connected between the source and the ground voltage, and the gate is connected to an input terminal of the first control signal B.

In the NMOS transistors NM21 through NM27, a gate and a drain are connected to each other.

The active differential amplifier 30 includes a first differential amplifier 31 consisting of PMOS transistors PM2 and PM3 and NMOS transistors NM3, NM4, and NM2, a PMOS transistor PM I connected between an external voltage terminal and an output node 104 of the first differential amplifier 31, in which a gate is connected to an input terminal of the first control signal B, an NMOS transistor NM5 serially connected between the output node of the first differential amplifier 31 and a ground voltage, in which a gate is connected to a detection node 91 of the voltage level detector 20, an NMOS transistor NM1, in which a gate is connected to an input terminal of the first control signal B, and a PMOS transistor PM4 connected between an external voltage terminal and the internal source voltage terminal 109, in which a gate is connected to an output node 104 of the first differential amplifier 31.

In addition, the inputs to the first differential amplifier 31 is performed through a gate of the NMOS transistor NM3 connected to an output node 89 of the reference voltage generator 70 and a gate of the NMOS transistor NM4 connected to the inter source voltage terminal 106. A gate of the NMOS transistor NM2 is connected to an input terminal of the first control signal B.

The standby differential amplifier 41 includes a second differential amplifier 41 consisting of PMOS transistors PM5 and PM6, and NMOS transistors NM7, NM8, and NM9, an NMOS transistor NM6 connected between an external voltage terminal and an output node 107 of the second differential amplifier 41, in which a gate is connected to an input terminal of a second control signal C, and a PMOS transistor PM7 connected between an external voltage terminal and the terminal 106 of the internal source voltage terminal Vint, in which a gate is connected to an output node 107 of the second differential amplifier 41.

In addition, the input to the second differential amplifier 41 is performed through a gate of the NMOS transistor NM7 connected to an output node 89 of the reference voltage generator 10 and a gate of the NMOS transistor 10 connected to the internal source voltage terminal 109.

The operation of the conventional internal voltage generating circuit will now be explained.

Figure 2A:
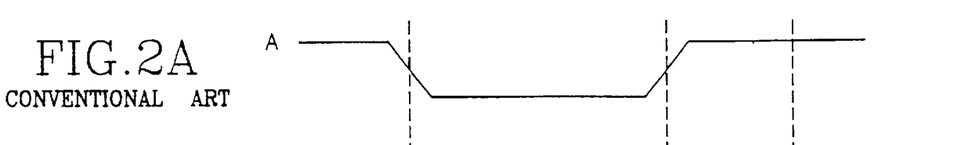
FIG. 2A is a view of a timing in accordance with an external chip selection signal of each element of FIG. 1.
Figure 2B:
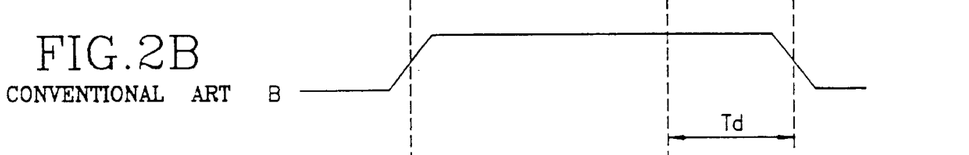
FIG. 2B is a view of a timing of a control signal applied to an active differential amplifier of FIG. 1.

To begin with, when an external chip selection signal A shown in FIG. 2A is a low level, an active control signal B shown in FIG. 2B becomes a high level, and the inner voltage generating circuit becomes active (S1), and when the external chip selection signal A is a high level, the standby control signal C becomes a low level, and the internal voltage generating circuit becomes a standby state (S2).

Thereafter, the reference voltage generator 10 generates a predetermined reference voltage with respect to an external voltage and outputs the reference voltage to the active differential amplifier 30 and the standby differential amplifier 40.

In addition, when an active control signal B becomes a high level, that is, in case that the internal voltage generating circuit is in an active step (S1), the PMOS transistor PM1 is turned off, and the NMOS transistor NM2 of the first differential amplifier 31 is turned off, and the first differential amplifier 31 becomes activated.

Figure 3:
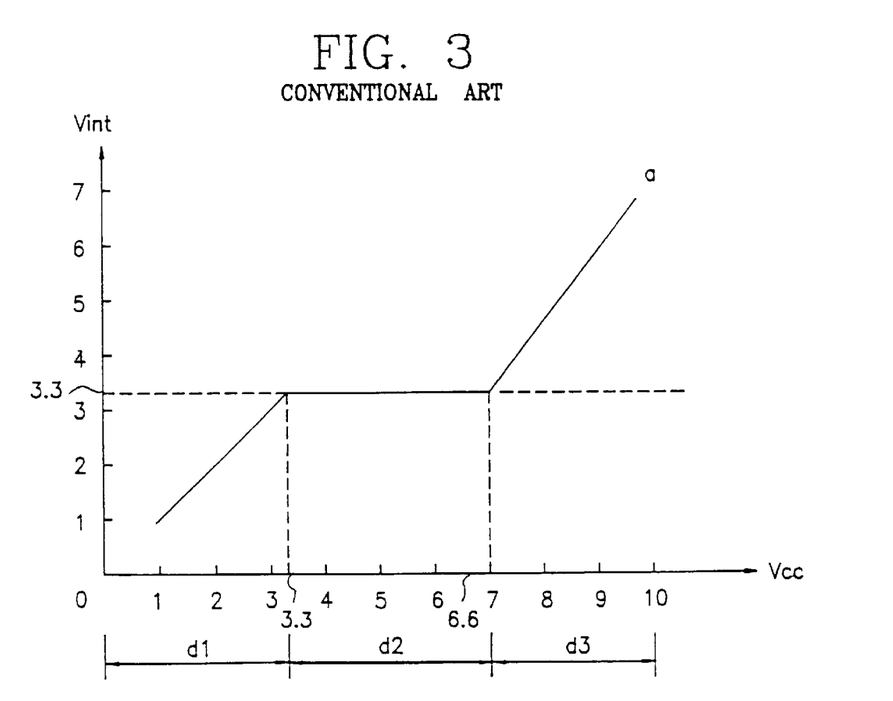
FIG. 3 is a graph of an internal source voltage with respect to a conventional external source voltage.

At this time, in case that an external voltage is within a first range (d1) of FIG. 3, the NMOS transistor NM5 of the first differential amplifier 31 is turned off in accordance with a reference voltage Vref outputted from the reference voltage generator 10, the amount of the current voltage flowing to the NMOS transistor NM2 through the PMOS transistor PM2 and the NMOS transistor NM3, respectively, is much greater than that of the current voltage flowing to the NMOS transistor NM2 through the PMOS transistor PM3 and the NMOS transistor NM4, respectively.

Therefore, the output voltage from the output node 104 is a low level, and the PMOS transistor PM4 is turned on, and the internal source voltage linearly increase in proportion to the increase of the external voltage.

Thereafter, when an external voltage is within a second range (d2) of FIG. 3, the reference voltage level Vref which is an input voltage of the NMOS transistor NM3 of the first differential amplifier 31 and the internal source voltage level of the input voltage of the NMOS transistor NM4 are the same, so the current voltage in the first differential amplifier 31 keeps a constant level, and the internal source voltage maintains a constant level even if an external voltage increases because a constant voltage level is applied to the gate of the PMOS transistor PM4.

The burn-in operation is directed to testing a chip by applying voltage and temperature greater than a normal level to the chip so that an initial defect of a semiconductor chip can be checked.

Therefore, beyond a burn-in entry voltage which enters a burn-in starting range in excess of a normal operating range of an external voltage, an internal source voltage linearly increases in proportion to an external voltage.

Thereafter, as an external voltage increases, when it exceeds 7-volt which is within a third range d3 of FIG. 3, the voltage level of the detection node 91 of the voltage level detector 20 becomes a predetermined level enough to turn on the NMOS transistor NM5 of the active differential amplifier 30, and the chip mode is converted into the burn-in operation mode. At this time, in the detection node 91, the voltage Vdd-5|Vtn| which is decreased in accordance with a threshold voltage level Vtn of each NMOS transistor of the PMOS transistor row 90 appears.

Therefore, as the NMOS transistor NM5 is turned on, there is formed a path of a current voltage connected to a ground through the NMOS transistors NM5 and NM1, and the voltage level of the output node 104 of the first differential amplifier 31 becomes a low level, and the PMOS transistor PM4 is turned on, and the internal source voltage linearly increases as shown in FIG. 3.

Thereafter, when the internal source voltage level is increased by a certain external element, the level of the internal source voltage applied to the gate of the NMOS transistor NM4 of the first differential amplifier 31 becomes greater than that of the reference voltage Vref applied to the gate of the NMOS transistor NM3, and the amount of the current voltage flowing to the NMOS transistor NM2 through the PMOS transistor PM3 and the NMOS transistor NM4 is much greater than that of the current voltage flowing to the NMOS transistor NM2 through the PMOS transistor PM2 and the NMOS transistor NM3, and the output node 104 becomes a high level, and the PMOS transistor PM4 in which its gate is connected to the output node 104 is turned off, so that the internal source voltage are not increased.

In addition, in the standby differential amplifier 4, when a standby control signal C becomes a high level, the NMOS transistor NM6 is turned on, and the output node 107 of the second differential amplifier 41 becomes a level of Vcc-Vtn, wherein the Vtn is a threshold voltage of the NMOS transistor, and the PMOS transistor PM7 in which its gate is connected to the output node 107, and the standby differential amplifier 3 is turned off.

Meanwhile, when the control signal C is converted from a high state to a low state, the NMOS transistor NM6 is turned off, and the standby differential amplifier 40 becomes activated, and the internal voltage generating circuit enters the standby step (S2).

At this time, when the external voltage is within the first range d1 of FIG. 3, the reference voltage applied to the gate of the NMOS transistor NM7 of the second differential amplifier 41 becomes greater than that of the internal source voltage applied to the gate of the NMOS transistor NM8, and the amount of the current flowing to the NMOS transistor NM9 through the PMOS transistor PM5 and the NMOS transistor NM7 becomes greater than that of the current voltage flowing to the NMOS transistor NM9 through the PMOS transistor PM6 and the NMOS transistor NM8, so that the output node 107 of the second differential amplifier 41 becomes a low level.

Therefore, as the PMOS transistor PM7 is turned on, the internal source voltage linearly increases in proportion to the increase of the external voltage.

Thereafter, as the external voltage increases, when it is within the second range d2 of FIG. 3, the reference voltage level which is an input voltage of the NMOS transistor NM7 of the second differential amplifier 31 and the internal source voltage level which is an input voltage of the NMOS transistor NM8 are the same, so the level of the current voltage flowing to the second differential amplifier 41 is constant, and the internal source voltage maintains a constant level even if the external voltage increases as a constant level of voltage is applied to the gate of the PMOS transistor PM4.

In addition, when the external voltage level exceeds 7-volt as in the third range d3 of FIG. 3, the chip enters a burn-in operation mode, and since the standby differential amplifier 40 does not have a current voltage flowing in the path like the NMOS transistor NM5 of the active differential amplifier 30, the output node 107 of the second differential amplifier 40 always outputs a high level voltage. Therefore, the PMOS transistor PM7 is turned off, and the internal source voltage keeps a constant level even if the external voltage exceeds a certain level of 7-volt.

In addition, when the control signal B is disabled in a low level state, as the PMOS transistor PM1 is turned on, the external of a high level is applied to the gate of the PMOS transistor PM4, and the active differential amplifier 3 is turned off.

Figure 2C:
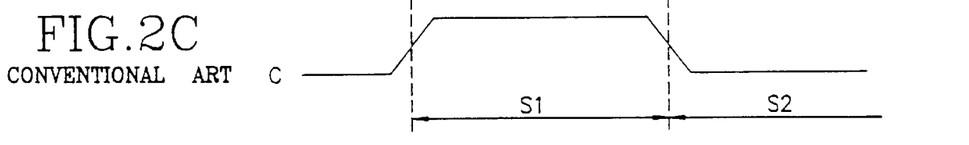
FIG. 2C is a view of a timing of a control signal applied to a stand differential amplifier of FIG. 1.

However, as shown in FIGS. 2A through 2C, while the external chip selection signal A is converted from a low level to a high level, since the active control signal B becomes a low level from a high level with a predetermined delay time Td, the active differential amplifier 30 operates during the delay time Td so as to prevent the drop of the internal source voltage caused by power consumption even if all the signals applied to the chip are disabled.

Therefore, the stable operation can be achieved at the time of the active operation and the standby operation.

However, when the threshold voltage Vtn of the NMOS transistors NM21 through NM24 varies due to manufacturing variations or audible noise, the voltage Vcc-5Vtn of the detection node 91 varies, and the conversion from the normal operation mode to the burn-in operation mode or from the burn-in operation mode to the normal operation mode can disadvantageously be performed.

That is, when the threshold voltage Vtn of the NMOS transistors NM21 through NM24 is decreased, the voltage level of the detection node 91 increases. At this time, the chip erroneously recognizes that the external voltage is in a burn-in operation mode condition, so the chip enters the burn-in operation mode from the normal operation mode. In addition, as the threshold voltage Vtn increases, the voltage level of the detection node 91 is decreased, the chip erroneously recognizes that the external voltage is not in a burn-in operation mode, so the chip enters the normal operation mode from the burn-in operation mode. Moreover, it can disadvantageously take much time to obtain a desired reference voltage level when an internal voltage drops, so that it is hard to achieve a desired stable internal voltage.

SUMMARY OF THE INVENTION

Accordingly, it is an object of the present invention to provide an internal voltage generating circuit for a semiconductor memory apparatus, which overcome the problems encountered in a conventional internal voltage generating circuit for a semiconductor memory apparatus.

It is another object of the present invention to provide an improved internal voltage generating circuit for a semiconductor memory apparatus capable of enhancing reliability and stability of a burn-in operation by providing the BEN and the BEX which have a certain hysteresis characteristic and are capable of compensating a possible internal source voltage drop by increasing internal source voltage by supplying a constant current to an external voltage through a driving transistor when a sense amplifying circuit which consume more voltage starts operating.

To achieve the above object, there is provided an internal voltage generating circuit for a semiconductor memory apparatus, which includes a first reference voltage generator for generating a bias reference voltage; a voltage level detector for detecting an external voltage at the time of a burn-in operation by receiving the output of the first reference voltage generator; a second reference voltage generator for generating a reference voltage which is obtained by amplifying a voltage level by a certain ratio; a standby differential amplifier for comparing the reference voltage outputted from the second reference voltage generator and an internal source voltage and for controlling a drive at the time of a standby; and an active differential amplifier for comparing the reference voltage of the second reference voltage generator and an internal source voltage and for compensating an internal source voltage drop at the time when a sense amplifier becomes activated.

DETAILED DESCRIPTION OF THE INVENTION

Figure 4:
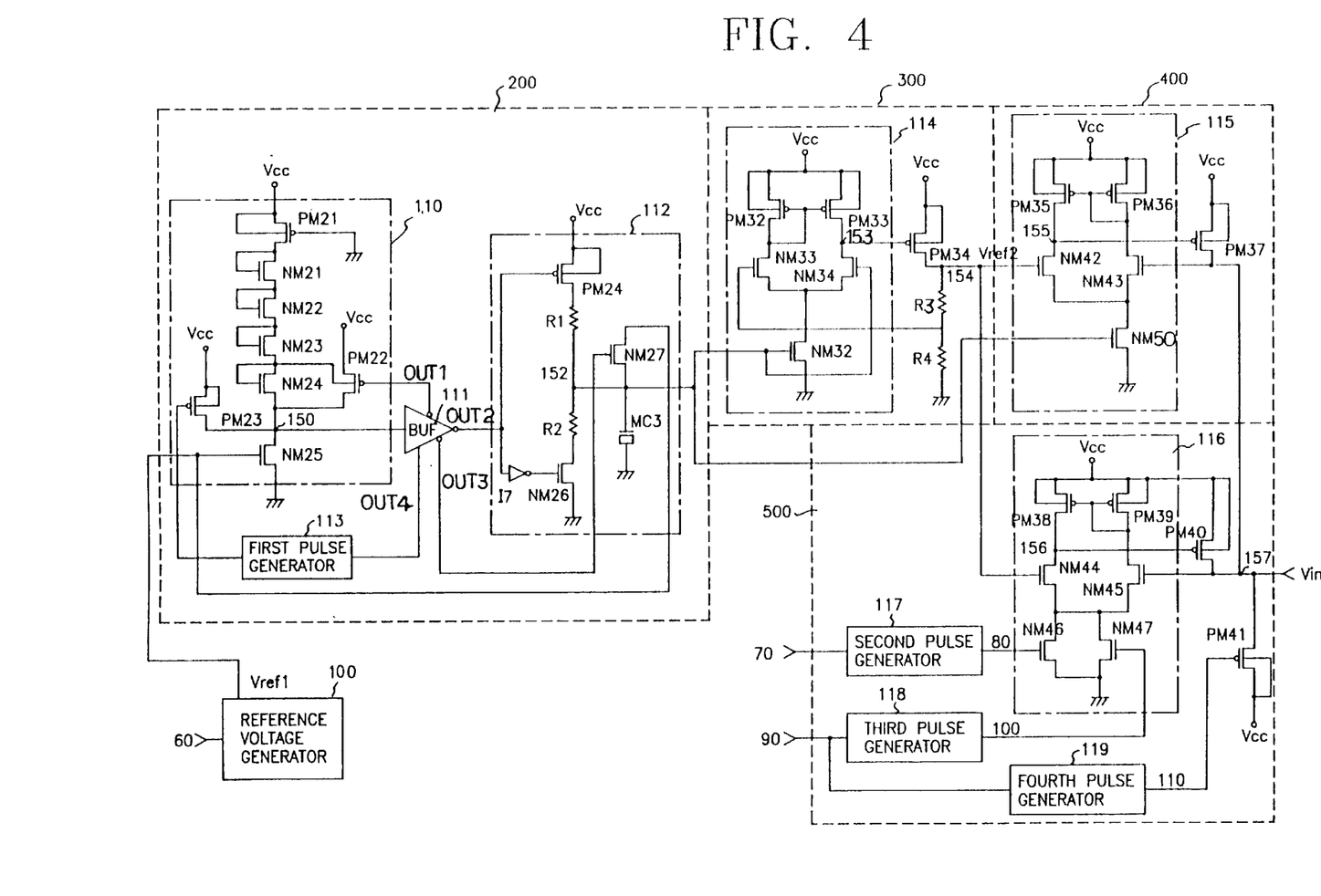
FIG. 4 is a block diagram of an internal voltage generating circuit for a semiconductor memory apparatus according to the present invention.
Figure 5:
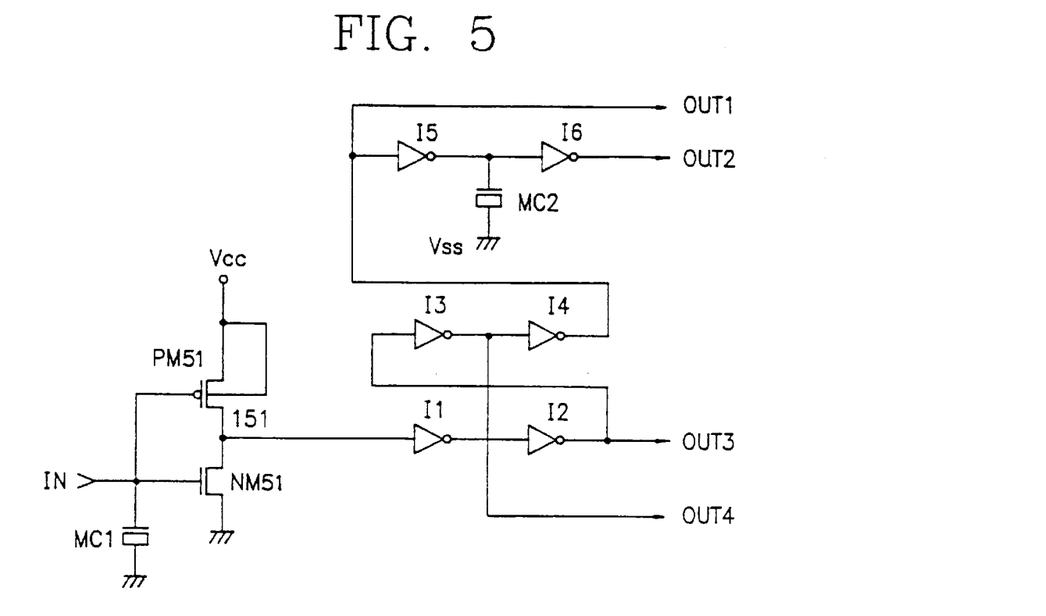
FIG. 5 is a block diagram of a buffer of FIG. 4.

Referring to FIGS. 4 and 5, an internal voltage generating circuit according to the present invention includes a first reference voltage generator 100 for generating a bias reference voltage Vref1, a voltage level detector 200 for detecting an external voltage during a burn-in operation in accordance with an output of the first reference voltage generator 100, a second reference voltage generator 300 for generating a reference voltage Vref2 in accordance with an output of the voltage level detector 200, a standby differential amplifier 400 for comparing the reference voltage of the second reference voltage generator 300 and an internal source voltage at a standby step and for controlling a drive, and an active differential amplifier 500 for comparing the reference voltage of the second voltage generator 300 and an internal source voltage at an active step.

The voltage level detector 200 includes an external voltage detector 110 activated in accordance with the reference voltage Vref1 of the first reference voltage generator for detecting an external voltage and for latching when the detected voltage exceeds a predetermined level, a buffer 111 for buffering the output voltage of the external voltage detector 110, an external voltage divider 112 for dividing the external voltage in accordance with the output of the buffer 111, and a first pulse generator 113 for generating pulses in accordance with the output of the buffer 111 and for controlling the latch operation of the external voltage detector 110.

The external detector 110 includes a PMOS transistor PM21 in which its source receives an external voltage and its gate is connected to ground, NMOS transistors NM21 through NM24, in which a gate and a drain are serially connected between the source of the PMOS transistor PM21 and a detection node 150, a PMOS transistor PM22 in which its gate is connected to the drain of the NMOS transistor NM24 and the first output terminal of the buffer 111 and its drain for receiving a voltage is connected to the source of the NMOS transistor NM24, an NMOS transistor NM25 connected between the detection node 150 and a ground voltage in which its gate is connected to the output terminal of the first reference voltage, and a PMOS transistor PM23 connected between an external voltage terminal and the detection node 150 in which its gate is connected to the output terminal of the first pulse generator 113.

The buffer 111 includes a PMOS transistor PM51 connected between an external voltage terminal and the output node 151 in which its gate is grounded through a MOS condenser MC1, an NMOS transistor NM51 connected between the output node 151 and a ground voltage in which its gate is connected to the detection node 150, and inventors I1 through I6 each serially connected to the output node 151. Mere, the inventor I5 and the inventor I6 are connected to the ground through the MOS condenser MC2. In addition, a first output OUT1 is the output of the inventor I4, and a second output OUT2 is the output of the inventor I6, and a third output OUT3 is the output of the inventor I2, and a fourth output OUT4 is the output of the inventor I3.

The external voltage divider 112 includes a PMOS transistor PM31 in which its gate is connected to the second output terminal OUT2 of the buffer 111, an NMOS transistor NM31 in which its gate is connected to the second output terminal OUT 2 of the buffer 111 and its source is connected to the ground, resistances R1 and R2 provided for dividing an external voltage and connected between the PMOS transistor PM31 and the NMOS transistor NM31, and an NMOS transistor NM32 in which its gate is connected to the third output terminal OUT 3 of the buffer 111 and its drain is connected to the output terminal of the reference voltage generator 100 and its source is connected to the round through the MOS condenser MC1 and its output terminal is connected the output terminal 152.

The second reference voltage generator 300 includes a first differential amplifier 114 having PMOS transistors PM32 and PM33 and NMOS transistors NM33, NM34 and NM32, a PMOS transistor PM34 in which its source is connected to the external voltage terminal and its gate is connected to the output node of the first differential amplifier 114, a PMOS transistor PM1 in which its gate is connected to the input terminal of a first control signal (B), and resistances R3 and R4 for dividing the output signals of the PMOS transistor PM34 and for applying the signal to the gate of the NMOS transistor NM33 of the first differential amplifier 114.

In addition, the input to the first differential amplifier 114 is performed through the gate of the NMOS transistor NM33 receiving voltage of the output node 154 thorough the resistances R3 and R4 and the gate of the NMOS transistor NM34 connected to the output terminal of the external voltage divider 112.

The standby differential amplifier 400 includes a second differential amplifier 115 having PMOS transistors PM35 and PM36 and NMOS transistors NM42, NM43 and NM45, and a PMOS transistor PM37 in which its gate is connected to the output node 154 of the second differential amplifier 115.

In addition, the input to the second differential amplifier 115 are performed through the gate of the NMOS transistor NM42 connected to the output node 154 of the second reference voltage generator 300 and the gate of the NMOS transistor NM43 connected to the inter source voltage terminal 156. The output voltage of the external voltage divider 112 is applied to the gate of the NMOS transistor NM45.

The active differential amplifier 500 includes PMOS transistors PM38 and PM39 and NMOS transistors NM44, NM45, NM46, and NM47, a second pulse generator 117 for applying a pulse signal 90 to the gate of the NMOS transistor NM46 of the third differential amplifier 116 in accordance with a control signal 70, a third pulse generator 118 for applying a pulse signal 100 to the gate of the NMOS transistor NM47 of the third differential amplifier 116 in accordance with a control signal 80, a fourth pulse generator 119 for generating a pulse signal 110 in accordance with a control signal 80, a PMOS transistor PM40 connected between the external voltage terminal and the internal source voltage terminal 156 in which its gate is connected to the output node 155 of the third differential amplifier 116, and a PMOS transistor PM41 in which its source is connected to the internal source voltage terminal 156 and its gate receives the pulse signal 110 of the fourth pulse generator 119 and its drain is connected to the external voltage terminal.

In addition, the input to the third differential amplifier 116 are performed through the gate of the NMOS transistor NM44 connected to the output node 154 of the second reference voltage generator 300 and the gate of the NMOS transistor NM45 connected to the internal source voltage terminal 157.

The operation of the internal voltage generating circuit for a semiconductor memory apparatus according to the present invention will now be explained with reference to FIGS. 4 and 6.

To begin with, referring to FIG. 4, when a signal 60 corresponding to a voltage Vbb is inputted into the first reference generator 100, the first reference generator 100 outputs a reference voltage Vref1 of 1.0 V, and the NMOS transistor NM25 of the external voltage detector 110 is turned on in accordance with the reference voltage Vref1, and the voltage of the detection node 150 is a low level.

Thereafter, as the level of the external voltage increases, in case that the level of the voltage Vcc-4Vtn of the detection node 150 is lower than that of the threshold voltage Vtn of the NMOS transistor NM51 of the buffer, the chip works under a normal operating mode.

Therefore, the NMOS transistor NM51 of the buffer is turned off, and an external voltage is sequentially inputted to the serially connected inventors I1 through I6 through the output node 151, and a voltage of a high level is outputted from the first output terminal OUT1, the second output terminal OUT2, and the third output terminal OUT3 of the buffer 111, a voltage of a low level is outputted from the fourth output terminal OUT4, and the NMOS transistor PM22 connected to the first output terminal OUT1, the PMOS transistor PM24 of the external voltage divider 112 connected to the second output terminal OUT2, and the first pulse generator 113 connected to the NMOS transistor NM26 and the fourth output terminal OUT4 are turned off, and the NMOS transistor NM27 of the external voltage divider 112 connected to the third output terminal OUT is turned on.

Therefore, the reference voltage Vref1 of the first reference voltage generator 100 is inputted to the second reference voltage generator 300 and the standby differential amplifier 400, respectively, for a biasing.

Thereafter, when the external voltage is increased, a bum-in mode is determined in accordance with the level of voltage Vcc-4Vtn of the detection node 150.

That is the following expressions can be expressed at the detection node 150 in accordance with a variation of the external voltage.

$Vcc-4Vtn > Vtn$ of NM51—a normal operation mode→a burn-in operation mode  formula I $Vcc-4Vtn+\Delta < Vtn$ of NM51—a burn-in operation mode→a normal operation mode  formula II In the above formula II, a $\Delta$ denotes a voltage which is determined when the PMOS transistor PM22 is turned on the relationship between the burn-in entry voltage BEN in which the operation state of the chip is converted from the normal operation mode to the burn-in operation mode and the burn-in exit voltage BEX in which the operation state of the chip is converted into the normal operation mode at the burn-in operation mode has a hysteresis characteristic.

That is, when the operation state of the chip is converted from the normal operation mode to the burn-in operation mode, the voltage Vcc-4Vtn of the detection node 150 should be big enough to turn on the NMOS transistor NM51 of the buffer 111. When the operation state of the chip is converted from the burn-in operation mode to the normal operation mode, the voltage "Vcc-4Vtn+$\Delta$" of the detection node 150, that is, the voltage Vcc-3Vtn of the detection node 150 when the PMOS transistor PM22 is turned on should be small enough to turn off the NMOS transistor NM15 of the buffer 111.

Therefore, referring to FIG. 4, when the voltage Vcc-4Vtn of the detection node 150 of the external voltage detector 110 is a predetermined level enough to turn on the NMOS transistor NM51 of the buffer 111, the operation state of the chip is converted from the normal operation mode to the burn-in operation mode, and the NMOS transistor NM51 of the buffer 111 is turned on, and a signal of a low level is outputted from the first output terminal OUT1, the second output terminal OUT2, and the third output terminal OUT3, and a signal of a high level is outputted from the fourth output terminal OUT4.

Thereafter, the first pulse generator 113 connected to the fourth output terminal OUT4 outputs a signal of a low level and turns on the PMOS transistor PM23 and latches the voltage of the detection node 150 to the external voltage.

Therefore, the more correct conversion of the burn-in operation mode is achieved.

Thereafter, as the PMOS transistor PM22 is turned by a signal of a low level outputted from the first output terminal OUT1 of the buffer 111, and as the NMOS transistor NM23 and the detection node 150 are connected, the voltage level of the detection node is Vcc-3Vtn.

The following expression can be obtained by subtracting the formula II related to the burn-in exit voltage from the formula I related to the burn-in entry voltage.

$$\delta = \Delta \qquad \text{formula III}$$

Therefore, the hysteresis voltage δ obtained by a difference between the burn-in entry voltage BEN and the burn-in exit voltage BEX is determined by the PMOS transistor PM22 of the external voltage detector 10.

After the operation state of the chip is converted to the burn-in operation mode, the voltage Vcc-3Vtn of the detection node 150 should be small enough to turn off the NMOS transistor NM51 of the buffer 111. That is, the burn-in exit voltage BEX is converted to the normal operation mode in case that the burn-in exit voltage BEX drops rather than the burn-in entry voltage BEN by a hysteresis voltage (Δ=1 Vtn).

Figure 6:
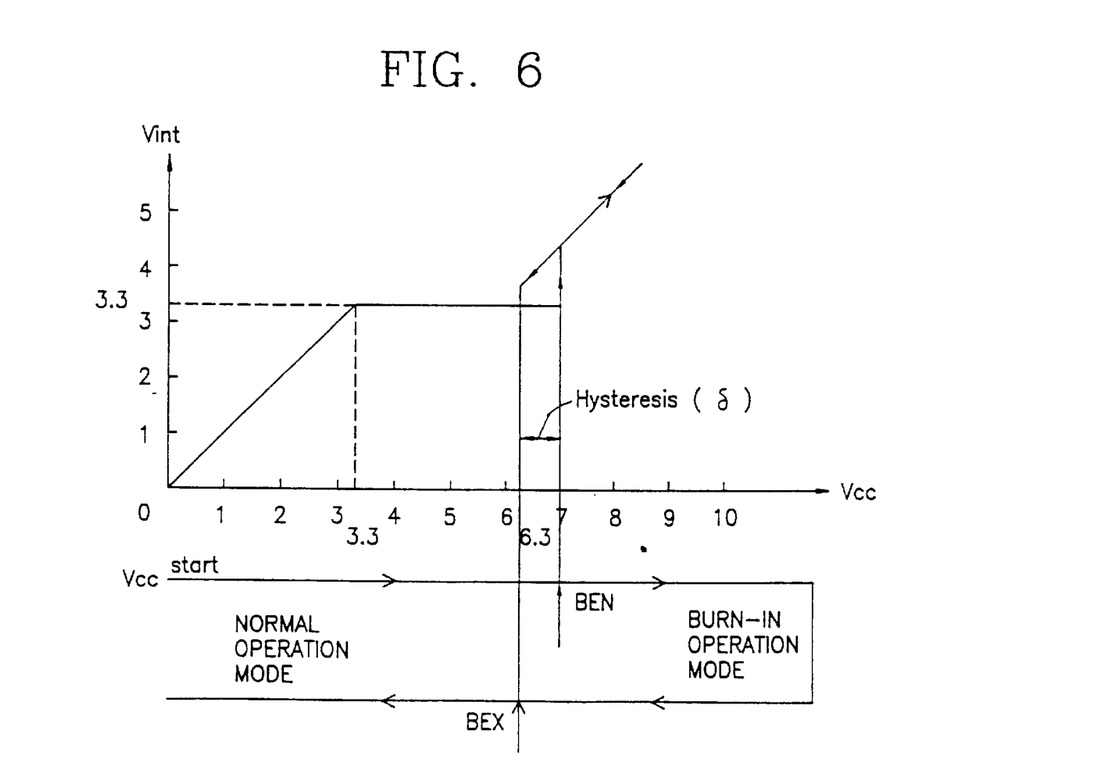
FIG. 6 is a graph of a hysteresis characteristic at a burn-in operation mode according to the present invention.

For example, as shown in FIG. 6, if |Vtn| is 0.7V, and if the NMOS transistor NM51 of the buffer receiving the voltage Vcc-4Vtn of the detection node 1500 is turned on at 4.2V, and as the external voltage level increases, if the burn-in entry voltage BEN is 7V, tile operation state of the chip is converted to the burn-in mode, and thereafter the voltage Vcc-3Vtn of the detection node 150 turns off the NMOS transistor NM51 of the buffer 111. When the level of the voltage Vcc-3Vtn of the detection node 150 is lower than 4.2V, that is, when the burn-in exit voltage BEX is 6.3V, the operation state of the chip is converted from the burn-in operation mode to the normal operation mode as the voltage Vcc-3Vtn of the detection node 150 turns off the NMOS transistor NM51 of the buffer 111.

Therefore, at the normal operation state, a voltage of a high level is outputted from the first output terminal OUT1, the second output terminal OUT2, and the third output terminal OUT3, and a voltage of a low level is outputted from the fourth output terminal OUT4 of the buffer 11, and the NMOS transistor PM22 and the first pulse generator 113 and the PMOS transistor PM24 of the external voltage divider 112 and the NMOS transistor NM26 are turned off, respectively, and the NMOS transistor NM26 of the external voltage divider 112 is turned on, and the reference voltage Vref1 of the first reference voltage generator 100 is inputted to the second reference generator 300 and the standby differential amplifier 400, respectively.

In addition, at the burn-in operation mode, a voltage of a low level outputted from the second output terminal OUT2 of the buffer 11 turns on the NMOS transistor NM26 through the PMOS transistor PM24 and the inventor I7 of the external voltage divider 112, and a voltage of VccxR2/(R1+R2) is outputted from the output node 152.

Therefore, the second reference voltage generator 300 receives the reference voltage Vref1 outputted from the first reference voltage generator 100 and the voltage of VccxR2/(R1+R2) outputted from the external voltage divider 112 at the burn-in operation mode and outputs a constant reference voltage Vref2 to the standby differential amplifier 400 and the active differential amplifier 500.

Thereafter, the standby differential amplifier 400 compares the reference voltage Verf2 outputted from the second reference voltage generator 300 and the internal source voltage outputted from the source voltage terminal 157 and controls the internal source voltage.

Generally, when a sense amplifier works, the larger amount of the current is used, so the internal source voltage drops. Therefore, it is required to constantly maintain the internal source voltage so as to enhance credibility of semiconductor products and to save consumption voltage.

Figure 7A:
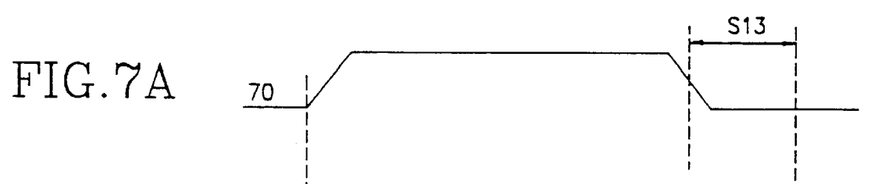
FIGS. 7A through 7E are diagrams showing input/output timing of second through fourth pulse generators.
Figure 7B:
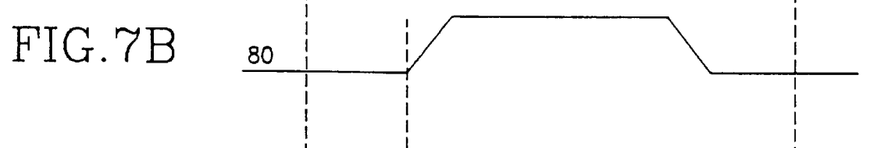
Figure 7C:
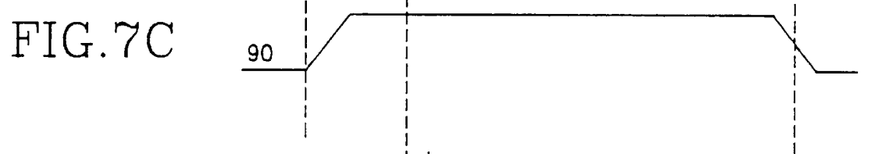
Figures 7D, 7E:
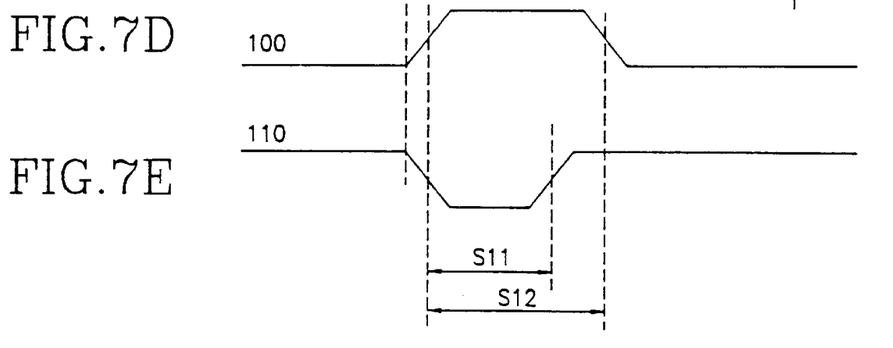

Therefore, referring to FIGS. 7A through 7E, when the chip is activated, in the active differential amplifier 500, the control signals 70 and 90 as shown in FIGS. 7A and 7C corresponding to the timing when a word line is enabled at a row buffer (not shown) in accordance with a row address strobe signal outputted from a row address strobe generator (not shown) are inputted to the second pulse generator 117, the third pulse generator 118, and the fourth pulse generator 119, the second pulse generator 117 outputs a control signal 80 as shown in FIG. 7B at the time when the sense amplifier becomes activated, and the third pulse generator 118 outputs a control signal 100 as shown in FIG. 7D within an operation possible range (S12) of the sense amplifier, and the fourth generator 119 outputs a control signal 110 of a low level within an operation possible range (S11) of the sense amplifier.

Therefore, at the time when a sense amplifier becomes activated, the NMOS transistor NM46 and the NMOS transistor NM47 of the third differential amplifier 116 are turned on, and the PMOS transistor PM40 is turned on, and the voltage level of the internal source voltage terminal 157 increases by an external voltage level which is applied to the PMOS transistor PM40.

Thereafter, when the sense amplifier becomes activated, the internal source voltage drops due to its voltage consumption; however, at this time, since the internal source voltage is increased tip to the external voltage by turning on the PMOS transistor, the drop rate of the internal source voltage is small.

In addition, when the level of the reference Vref2 outputted from the second reference voltage generator 300 is higher than that of the internal source voltage, the amount of the current flowing to the NMOS transistors PM46 and PM47 through the PMOS transistor PM38 and the NMOS transistor NM44 of the third differential amplifier 116 is larger than that of the current flowing to the NMOS transistors NM46 and NM47 through the PMOS transistor PM39 and the NM47, so a ground voltage is outputted from the output node 156.

Therefore, the PMOS transistor PM40 is turned on, and the internal source voltage is increased along the external voltage. At this time, when the voltage level between two input terminals of the third differential amplifier 116, the PMOS transistor PM40 is turned off, and the internal source voltage maintains a certain level.

Therefore, at the time when the sense amplifier becomes activated, the NMOS transistor NM46 and the NMOS transistor NM47 of the third differential amplifier 116 are turned on, respectively, and the PMOS transistor PM40 is turned on, and the voltage level of the internal source voltage terminal 157 is increased by the level of the external voltage which is applied to the PMOS transistor PM40.

Thereafter, when the sense amplifier becomes activated, the inter source voltage drops due to its voltage consumption; however, the drop rate of the internal source voltage is small since the internal source voltage is increased to the level of the external voltage by turning on the PMOS transistor PM40.

In addition, when the level of the reference voltage Vref2 outputted from the second reference voltage generator 300 is higher than that of the internal source voltage, in the third differential amplifier 116, the amount of the current flowing to the NMOS transistors NM46 and NM47 through the PMOS transistor PM38 and the NMOS transistor NM44 is larger than that of the current flowing to the NMOS transistors 46 and 47 through the PMOS transistor PM39 and the NMOS transistor NM45.

Therefore, the PMOS transistor PM40 is turned on. The internal source voltage is increased in accordance with the external voltage. At this time, when the voltage level between two input terminals of the third differential amplifier 116 are the same, the PMOS transistor PM40 is turned off, and the internal source voltage maintains a certain level.

In addition, as the amount of the current is increased by connecting the NMOS transistor NM47 to the third differential amplifier 116, the third differential amplifier 115 operates at a high speed, and the speed when the dropped internal source voltage is recovered to the reference level is increased.

In addition, as shown in FIGS. 7A through 7E, since the control signal 90 of a high level becomes a signal of a low level with a delay time (S13), even though the control signal 70 is disabled, the active differential amplifier 500 works for a delay time (S13) so as to prevent the internal source voltage drop due to the voltage consumption.

As described above, the internal voltage generating circuit for a semiconductor memory apparatus according to the present invention is advantageously directed to detecting a voltage level corresponding to a burn-in operation at a voltage level irrespective of a manufacturing variation, so that a reliability of the product can be enhanced. In addition, it has a hysteresis characteristic of the burn entry voltage and the burn-in exit voltage, so that the possible instability such as an oscillating phenomenon which is caused by noise inside the chip can be prevented, and the internal source voltage drop due to the current consumption when a sense amplifier becomes activated can be compensated by directly increasing the internal source voltage using the external voltage, and the recovering speed to the reference voltage level can be achieved by allowing the differential amplifier to have a desired operation speed.

What is claimed is:

1. An internal voltage generating circuit for a semiconductor memory apparatus, comprising:
   a first reference voltage generator for generating a bias reference voltage;
   a voltage level detector for detecting an external voltage at the time of a burn-in operation by receiving the output of said first reference voltage generator;
   a second reference voltage generator for generating a reference voltage which is obtained by amplifying a voltage level by a certain ratio;
   a standby differential amplifier for comparing the reference voltage outputted from said second reference voltage generator and an internal source voltage and for controlling a drive at the time of a standby; and
   an active differential amplifier for comparing the reference voltage of the second reference voltage generator and an internal source voltage and for compensating an internal source voltage drop at the time when a sense amplifier becomes activated.

2. The circuit of claim 1, wherein said voltage level detector includes:
   an external voltage detector operated by the reference voltage of the first reference voltage generator and provided for detecting an external source voltage and for latching when the detected voltage exceeds a certain voltage level;
   a buffer for buffering the output voltage of said external voltage detector;
   an external voltage divider for dividing an external voltage to a certain resistance ratio in accordance with the output of said buffer; and
   a first pulse generator for generating a pulse in accordance with the output of the buffer and for outputting the pulse to the external voltage detector.

3. The circuit of claim 2, wherein said certain voltage level is a burn-in entry voltage.

4. The circuit of claim 2, wherein said first pulse generator generates a pulse of a low level it the time when the operation state of chip is converted from a normal mode to a burn-in mode.

5. The circuit of claim 2, wherein said buffer includes:
   a PMOS transistor, connected between an external voltage terminal and an output node, in which its gate is connected to a ground through a MOS condenser;
   an NMOS transistor, connected between an output node and a ground voltage, in which its gate is connected to the detection node of the external voltage detector; and
   inventors each serially connected to the output node, so that a fifth inventor and a sixth inventor are connected to a ground through a MOS condenser.

6. The circuit of claim 2, wherein a first output terminal of said buffer is related to the output terminal of a fourth inventor, and a second output terminal is related to the output terminal of a sixth inventor, and a third output terminal is related to the output terminal of a second inventor, and a fourth output terminal is related to a third inventor.

7. The circuit of claim 2, wherein said external voltage detector includes:
   a PMOS transistor in which its source receives an external voltage and its gate is connected to a ground;
   NMOS transistors in which each gate and drain are connected to each other and the source of said PMOS transistor and a detection node are serially connected;
   a PMOS transistor in which its gate is connected to the first output terminal of the buffer, and its source receives a certain voltage, and its drain is connected to the source of the NMOS transistor;
   an NMOS transistor, connected between a detection node and a ground voltage, in which its gate is connected to the output terminal of the reference voltage generator; and
   a PMOS transistor, connected between an external voltage terminal and a detection node, in which its gate is connected to the output terminal of the first pulse generator.

8. The circuit of claim 7, wherein said PMOS transistor is directed to latching the voltage of a detection node in accordance with the output of the first pulse generator.

9. The circuit of claim 7, wherein said PMOS transistor is directed to providing a hysteresis characteristic between a burn-in entry voltage and a burn-in exit voltage by varying the voltage level of the detection node.

10. The circuit of claim 9, wherein said hysteresis voltage is 1V.

11. The circuit of claim 7, wherein the voltage of said detection node is Vcc4Vtn at a normal operation mode and is Vcc-3Vtn at a burn-in operation mode.

12. The circuit of claim 1, wherein said active differential amplifier includes:
- a third differential amplifier having PMOS transistors and NMOS transistors;
- a second pulse generator generating a pulse signal in accordance with a first control signal and for applying the pulse signal to the gate of the NMOS transistor of the third differential amplifier;
- a third pulse generator for generating a pulse signal in accordance with a second control signal and for applying the pulse signal to the gate of the NMOS transistor of the third differential amplifier;
- a fourth pulse generator for generating a pulse signal in accordance with said second control signal;
- a PMOS transistor, connected between an external voltage terminal and an internal source voltage terminal, in which its gate is connected to the output node of the third differential amplifier; and
- a PMOS transistor in which its source is connected to an internal source voltage terminal, and its gate is connected to the output terminal of the fourth pulse generator, and its drain is connected to an external voltage terminal.

13. The circuit of claim 11, wherein said second pulse generator and said third pulse generator and said fourth pulse generator generate pulses at the time when a sense amplifier becomes activated.

14. The circuit of claim 11, wherein said fourth pulse generator generates a pulse which becomes activated to a low level.

15. The circuit of claim 11, wherein said PMOS transistor increases an internal source voltage level at the time of the sense amplifier operation in accordance with an output of the fourth pulse generator.

* * * * *